United States Patent
Kim

(10) Patent No.: US 7,153,732 B1
(45) Date of Patent: Dec. 26, 2006

(54) METHODS OF FABRICATING TRANSISTORS IN SEMICONDUCTOR DEVICES

(75) Inventor: Hag Dong Kim, Suwon-si (KR)

(73) Assignee: Dongbu Electronics, Co., Ltd., Seoul (KR)

(*) Notice: Subject to any disclaimer, the term of this patent is extended or adjusted under 35 U.S.C. 154(b) by 0 days.

(21) Appl. No.: 11/024,994

(22) Filed: Dec. 28, 2004

(30) Foreign Application Priority Data

Dec. 31, 2003 (KR) ............ 10-2003-0101777

(51) Int. Cl.
*H01L 21/336* (2006.01)

(52) U.S. Cl. ............ 438/197; 438/259; 438/270; 438/294

(58) Field of Classification Search ........ 438/197, 438/259, 270, 299, 294, 298
See application file for complete search history.

(56) References Cited

U.S. PATENT DOCUMENTS

| | | | |
|---|---|---|---|
| 4,505,027 A | 3/1985 | Schwabe et al. ........ 29/577 C |
| 4,885,617 A | 12/1989 | Mazure-Espejo et al. .. 357/23.9 |
| 6,090,672 A | 7/2000 | Wanlass ............ 438/301 |
| 2003/0235943 A1* | 12/2003 | Trivedi ............ 438/197 |
| 2004/0084734 A1* | 5/2004 | Matsuo ............ 257/407 |

* cited by examiner

*Primary Examiner*—Hsien-Ming Lee
(74) *Attorney, Agent, or Firm*—Saliwanchik, Lloyd & Saliwanchik

(57) ABSTRACT

A example disclosed semiconductor fabrication method includes forming a well region in a semconductor substrate where device isolation structures are formed, depositing a buffer oxide layer and a nitride layer on the semiconductor substrate, forming a dummy gate by patterning the nitride layer; depositing a liner oxide layer and an insulation layer on the buffer oxide layer and the dummy gate and performing a planarization process, removing the dummy gate and implanting ions, removing the liner oxide layer and the insulation layer and performing a thermal treatment, and forming a polysilicon gate electrode by using the buffer oxide layer as a gate oxide layer.

11 Claims, 4 Drawing Sheets

METHODS OF FABRICATING TRANSISTORS IN SEMICONDUCTOR DEVICES

TECHNICAL FIELD

The present disclosure relates to semiconductor devices and, more particularly, to methods of fabricating transistors in semiconductor devices.

BACKGROUND

Generally, in semiconductor devices using Metal-Oxide-Semiconductor (MOS) transistors, the Critical Dimension (CD) of a gate electrode greatly affects the characteristics of the MOS transistor. The higher the degree of integration of the semiconductor device, the lower the CD of the gate electrode and finally, it causes a short channel effect. To minimize the short channel effect, dopants for the adjustment of a threshold voltage are implanted. However, this method is also facing a technological limit due to the increase in the degree of integration. So the method of halo ion implantation, in which dopants are implanted only into the lower side of source and drain regions, has been proposed to improve such a short channel effect.

FIG. 1 is a cross-sectional view illustrating the semiconductor device in accordance with the prior method of Halo ion implantation. Specifically, a gate oxide layer 7 and a gate electrode 9 are formed on a silicon substrate 1 including the impurity regions of a low concentration (the region of $N^-$ 3) and a high concentration (the region of $N^+$ 5). And nitride layers 11 and oxide spacers 3–13 are formed on both sidewalls of the gate electrode 9. In FIG. 1, number 15 indicates an oxide layer.

Accordingly, the prior method of the Halo ion implantation, wherein dopants are implanted using the gate electrode 9 and the oxide spacer 13 as a mask for the ion implantation, selectively forms an ion implantation region 17 only in the lower side of the source and drain regions including the impurity regions of the low concentration and the high concentration. Thus, it can prevent the rapid falling of the threshold voltage due to the short channel effect without the decrease of the channel mobility due to the whole increase of a threshold voltage.

However, for the prior method of halo ion implantation, because the regions for the halo ion implantation are formed in the area where the source and drain regions and the silicon substrate contact each other, a junction capacitance increases and a junction depth is affected. Therefore, it is difficult to adjust the threshold voltage of the device getting highly integrated.

DETAILED DESCRIPTION

Figure 1:
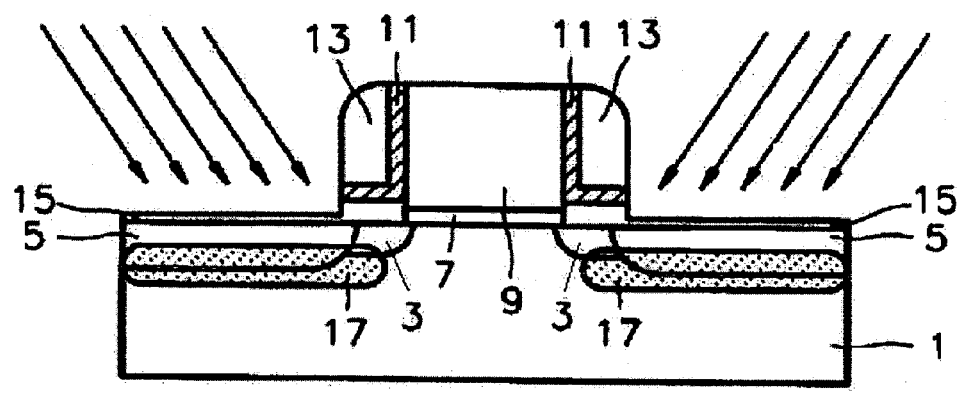
FIG. 1 is a cross-sectional view illustrating the semiconductor device in accordance with the prior method of halo ion implantation.
Figure 2A:
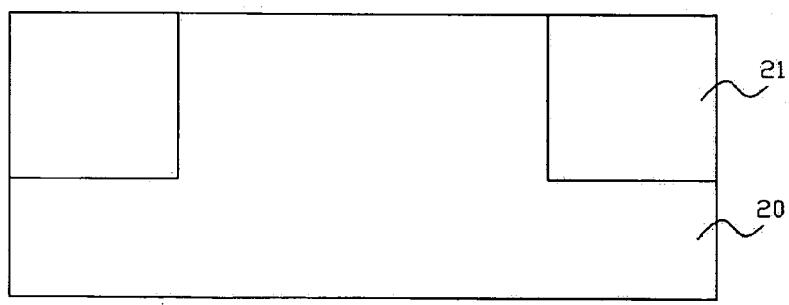
FIGS. 2a through FIG. 2h are cross-sectional views of semiconductor devices constructed in accordance with disclosed example processes of fabricating transistors.

Disclosed herein are methods of fabricating transistors that can control a short channel effect by forming a super steep retrograded (SSR). Referring to FIG. 2a, at first, ions are implanted to form a well region (not shown) into a semiconductor substrate 20 having device isolation structures 21. A thermal treatment is then performed to prevent the ions of the well region from being diffused. The ion implantation and the thermal treatment process for the formation of the well region may be performed before a damascene gate is formed.

Figure 2B:
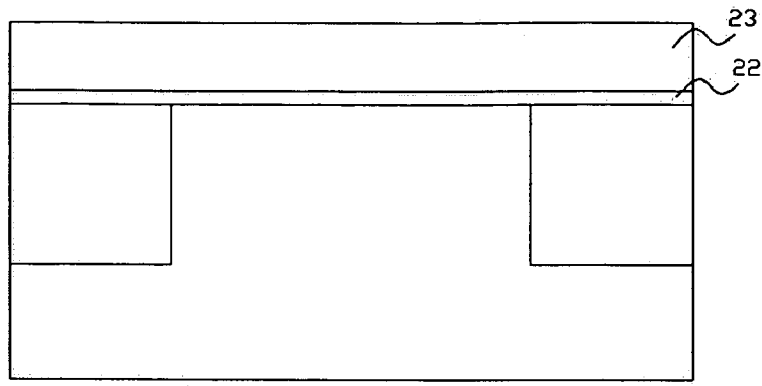

Referring to FIG. 2b, a buffer oxide layer 22 is deposited with a thickness between about 30 Å and about 60 Å on the upper part of the semiconductor substrate having the well region. Subsequently, a silicon nitride ($Si_3N_4$) layer 23 is deposited with the thickness of about 500 Å to about 3000 Å.

Figure 2C:
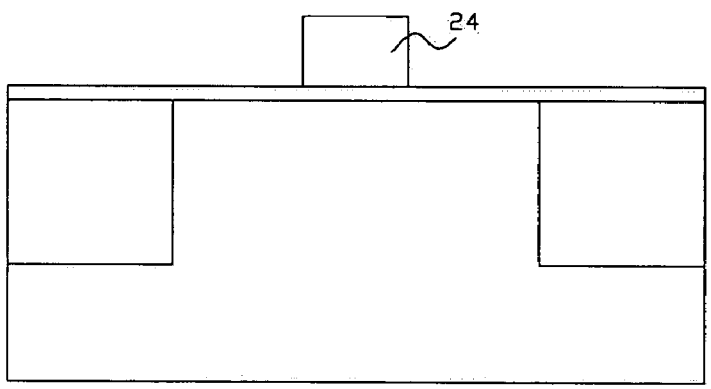

Referring to FIG. 2c, a pattern for the formation of a dummy gate 24 is formed from the nitride layer 23. The nitride layer 23, except for the dummy gate 24, is removed by etching.

Figure 2D:
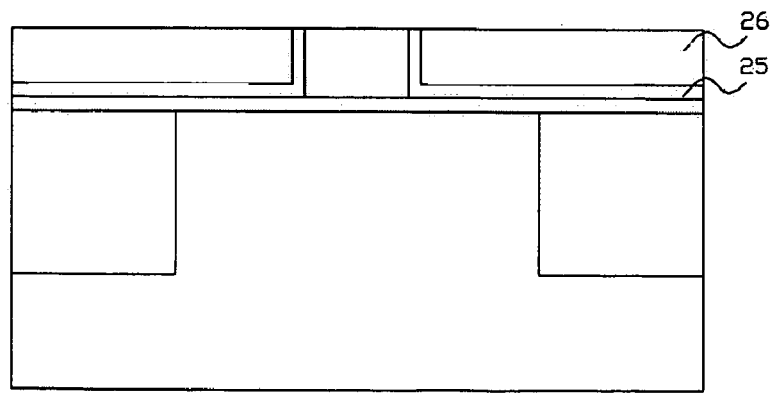

Referring to FIG. 2d, a low temperature oxide (LTO) layer 25 that plays a role of a liner oxide layer is formed with a thickness between about 50 Å and about 100 Å on the upper part of the buffer oxide layer 22 including the dummy gate 24. A Boron Phosphorus Spin-On-Glass (BPSG) insulation layer 26 is deposited with a thickness between about 2000 Å and about 3000 Å. A planarization process is then performed by using an etch-back or a Chemical Mechanical Polishing (CMP) process until the upper part of the dummy gate 24 is exposed.

Figure 2E:
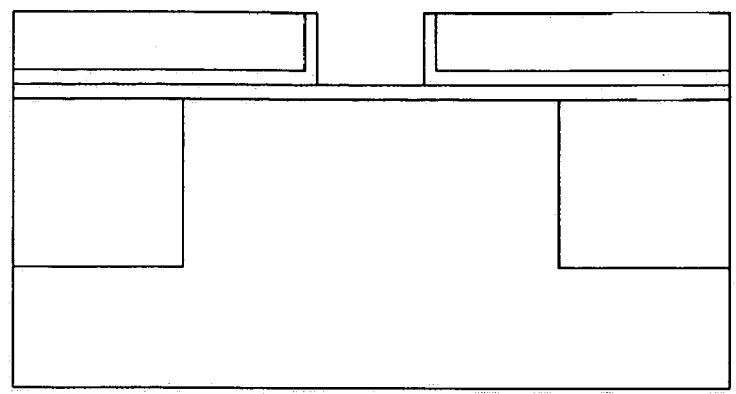

Referring to FIG. 2e, the dummy gate 24 is removed by a wet etch by using an etching solution which can etch the nitride layer 23, thereby a damascene pattern is formed.

Figure 2F:
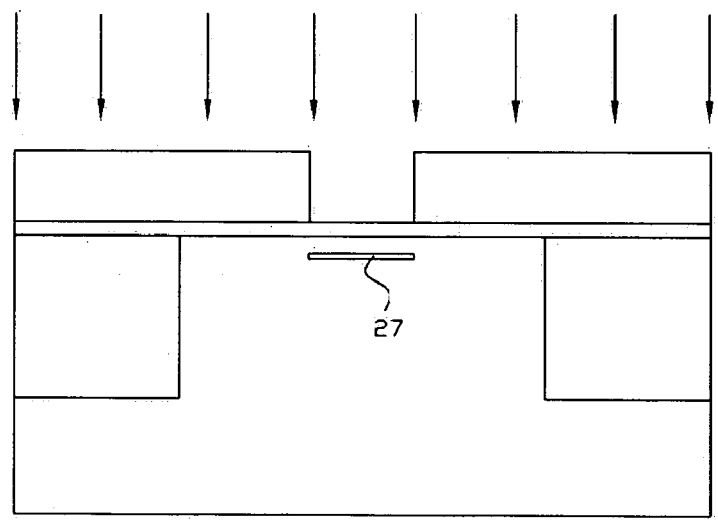

Referring to FIG. 2f, an ion implantation is performed by using the damascene pattern as a mask. Here, implanted ions depend on the device operation type in an active region. In detail, In ions are implanted for an N-type MOS (NMOS) type and Sb ions for a P-type MOS (PMOS) type. According to one example, $^{115}In^+$ ions and $^{121}Sb^+$ ions are implanted with implantation energy between about 100 keV and about 500 keV and at a dose between about $1\times10^{12}$ and about $5\times10^{13}$.

After the ion implantation, $N^{2+}$ ions may be implemented to increase a dielectric constant of a gate oxide layer and to suppress the creation of a hot electron. In one example, the $N^{2+}$ ions are implanted with implantation energy between about 10 keV and about 80 keV and at a dose between about $1\times10^{12}$ and about $1\times10^{13}$.

Figure 2G:
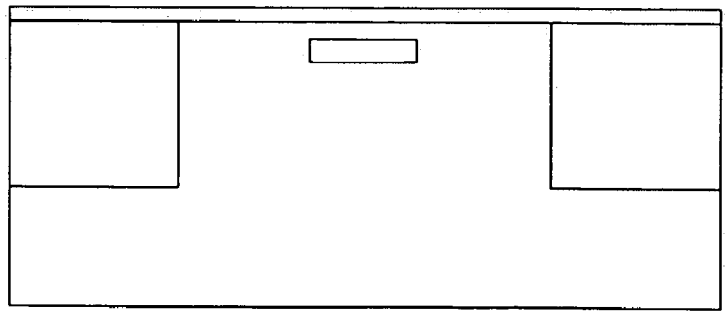

Referring to FIG. 2g, both the BPSG layer and the LTO layer are removed. An SSR channel 27 with a predetermined thickness is then formed by activating the ions through the thermal treatment of the substrate, where the ions are implanted. In one example, the thermal treatment is performed in an $N_2$ atmosphere at a temperature between about 800° C. and about 1000° C. for about 10 seconds to about 60 seconds.

If the thermal treatment has not been performed after the ion implantation for the formation of the well region as described above, it can be simultaneously performed with the SSR channel formation process.

Figure 2H:
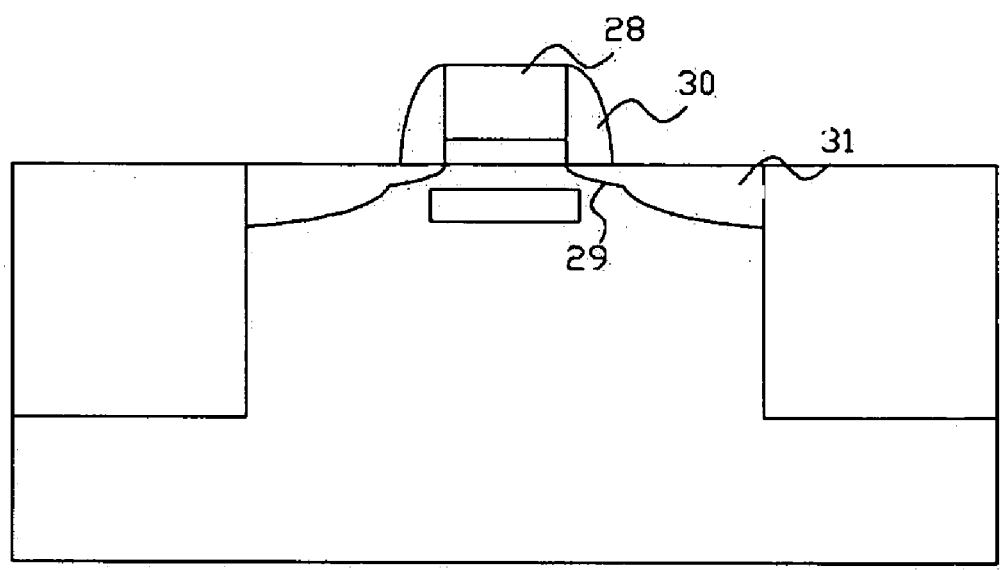

Referring to FIG. 2h, as in the prior art, a gate electrode is formed by depositing a polysilicon 28 on the upper part of the buffer oxide layer. The buffer oxide layer functions as a gate oxide layer. After the ion implantation for LDD regions 29 and the formation of spacers 30, source and drain regions 31 are formed.

Accordingly, the disclosed methods control a short channel effect by forming the SSR channel 27 through the local implantation of predetermined ions into the very region where a channel will be formed, by using a damascene gate pattern.

It is noted that this patent claims priority from Korean Patent Application Serial Number 10-2003-0101777, which was filed on Dec. 31, 2004, and is hereby incorporated by reference in its entirety.

Although certain example methods, apparatus, and articles of manufacture have been described herein, the scope of coverage of this patent is not limited thereto. On the contrary, this patent covers all methods, apparatus, and articles of manufacture fairly within the scope of the appended claims either literally or under the doctrine of equivalents.

What is claimed is:

1. A fabricating method of a transistor in a semiconductor device comprising:
    forming a well region in a semiconductor substrate where device isolation structures are formed;
    depositing a buffer oxide layer and a nitride layer on the semiconductor substrate;
    forming a dummy gate by patterning the nitride layer;
    depositing a liner oxide layer and an insulation layer on the buffer oxide layer and the dummy gate and performing a planarization process;
    removing the dummy gate and implanting ions;
    removing the liner oxide layer and the insulation layer and performing a thermal treatment; and
    forming a polysilicon gate electrode by using the buffer oxide layer as a gate oxide layer.

2. A method as defined by claim 1, wherein the well region is formed by implanting ions into the semiconductor substrate.

3. A method as defined by claim 2, wherein the well region is formed by performing a thermal treatment after the ions are implanted into the semiconductor substrate.

4. A method as defined by claim 1, wherein the buffer oxide layer is formed with a thickness between about 30 Å and about 60 Å.

5. A method as defined by claim 1, wherein the nitride layer comprises $Si_3N_4$ with a thickness between about 500 Å and about 3000 Å.

6. A method as defined by claim 1, wherein the liner oxide layer comprises LTO with a thickness between about 50 Å and about 100 Å.

7. A method as defined by claim 1, wherein the insulation layer comprises BPSG with a thickness between about 2000 Å and about 3000 Å.

8. A method as defined by claim 1, wherein the planarization process is performed through a CMP or an etch-back process.

9. A method as defined by claim 1, wherein In+ions for an NMOS type and SB+ions for a PMOS type are implanted with an implantation energy between about 100 keV and about 500 keV and at a dose between about $1\times10^{12}$ and about $5\times10^{13}$.

10. A method as defined by claim 1, wherein $N^{2+}$ ions are additionally implanted with an implantation energy between about 10 keV and about 80 keV and at a dose between about $1\times10^{12}$ and about $1\times10^{13}$.

11. A method as defined by claim 1, wherein the thermal treatment is performed in an $N_2$ atmosphere at a temperature between about 800° C. and about 1000° C. for about 10 seconds to about 60 seconds.

* * * * *